(12) United States Patent  
Eisenmann et al.

(10) Patent No.: US 7,568,180 B2  
(45) Date of Patent: Jul. 28, 2009

(54) GENERALIZATION OF THE PHOTO PROCESS WINDOW AND ITS APPLICATION TO OPC TEST PATTERN DESIGN

(75) Inventors: Hans Eisenmann, Tutzing (DE); Kai Peter, Friedberg (DE); Dennis Ciplickas, San Jose, CA (US); Jonathan O. Burrows, San Jose, CA (US); Yunqiang Zhang Zhang, Sunnyvale, CA (US)

(73) Assignee: PDF Solutions, San Jose, CA (US)

( * ) Notice: Subject to any disclaimer, the term of this patent is extended or adjusted under 35 U.S.C. 154(b) by 0 days.

(21) Appl. No.: 10/595,703

(22) PCT Filed: Feb. 22, 2005

(86) PCT No.: PCT/US2005/005456  
§ 371 (c)(1),  
(2), (4) Date: May 5, 2006

(87) PCT Pub. No.: WO2005/081910  
PCT Pub. Date: Sep. 9, 2005

(65) Prior Publication Data  
US 2008/0295061 A1   Nov. 27, 2008

Related U.S. Application Data

(60) Provisional application No. 60/548,488, filed on Feb. 26, 2004.

(51) Int. Cl.  
*G06F 17/50* (2006.01)
(52) U.S. Cl. .......................... 716/21; 716/5; 716/19
(58) Field of Classification Search .................. 716/2, 716/4, 5, 19, 21; 382/144  
See application file for complete search history.

(56) References Cited

U.S. PATENT DOCUMENTS

| | | | |
|---|---|---|---|
| 6,602,728 B1 | 8/2003 | Liebmann et al. | |
| 6,883,158 B1 | 4/2005 | Standstrom et al. | |
| 7,027,143 B1 * | 4/2006 | Stokowski et al. | 356/237.2 |
| 7,123,356 B1 * | 10/2006 | Stokowski et al. | 356/237.2 |
| 7,379,175 B1 * | 5/2008 | Stokowski et al. | 356/237.5 |

* cited by examiner

Primary Examiner—Sun J Lin

(57) ABSTRACT

A method comprises the steps of: (a) simulating on a processor a fabrication of a plurality of layout patterns by a lithographic process; (b) determining sensitivities of the layout patterns to a plurality of parameters based on the simulation; (c) using the sensitivities to calculate deviations of the patterns across a range of each respective one of the parameters; and (d) selecting ones of the patterns having maximum or near-maximum deviations to be used as test patterns.

20 Claims, 13 Drawing Sheets

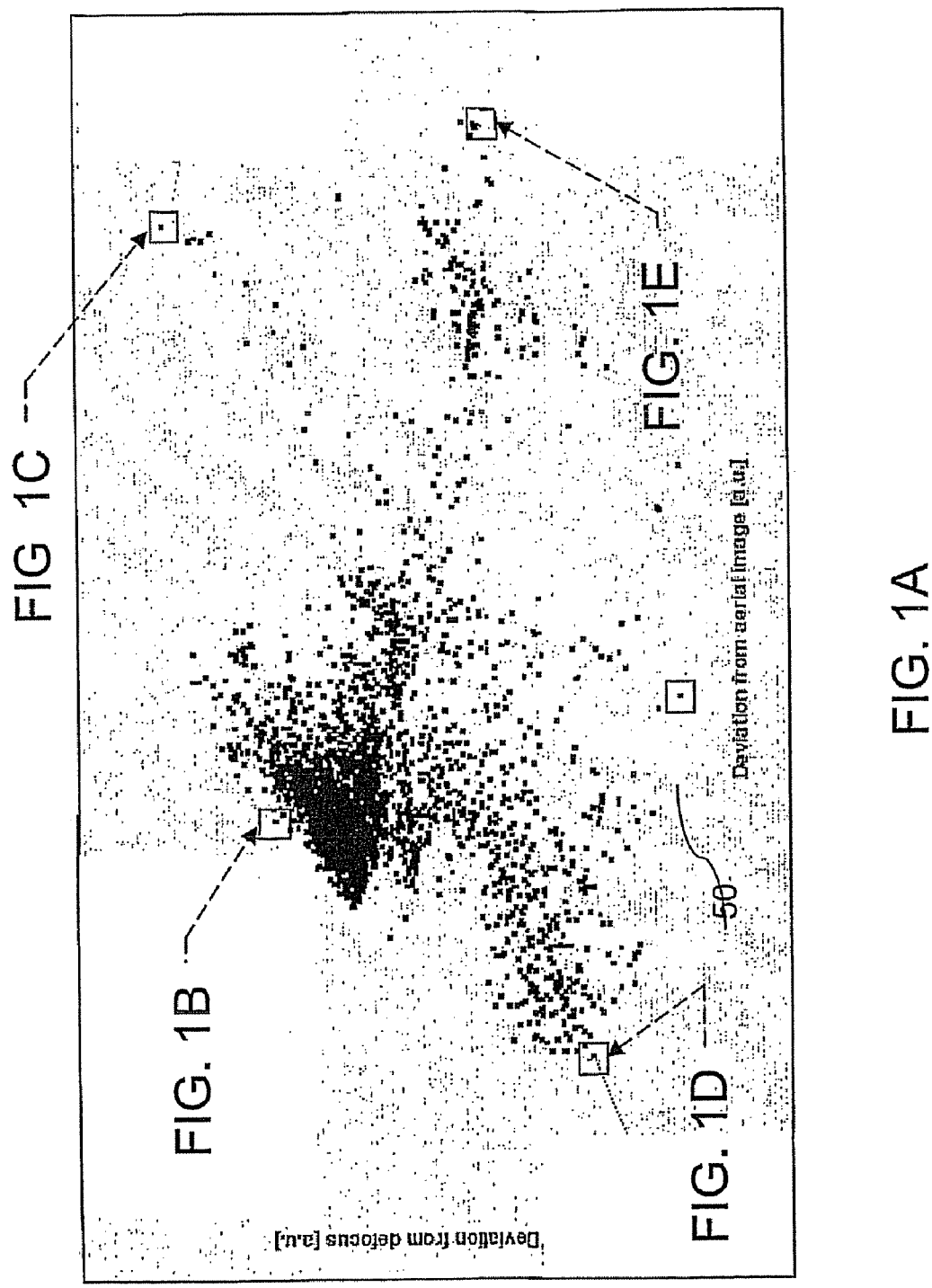

GENERALIZATION OF THE PHOTO PROCESS WINDOW AND ITS APPLICATION TO OPC TEST PATTERN DESIGN

This application claims the benefit of U.S. Provisional Patent Application No. 60/548,488, filed Feb. 26, 2004.

FIELD OF THE INVENTION

The present application relates generally to semiconductor fabrication, and more specifically to design of test structures for characterizing design and fabrication processes.

BACKGROUND

During technology development many parameters which influence process performance are not yet known. This can include layout information such as design rules, cell libraries, and optical parameters. The development may begin with a shrunken version of a cell library of the previous technology. The question then arises as to how this layout is transformed into silicon in the new lithography and process environment, which may also be preliminary. The designer must determine the critical locations in the layout.

There have been several publications in related areas. Recent approaches already proposed methods to statistically explore the relationship for CD, exposure and focus, (Shoji Mimotogi et al., "Statistical method for influence of exposure and focus error on CD Variation", SPIE 4346, 303-308, 2001) and additionally, for mask CD. (Sonny Y. Zinn et al., "Simulation of critical dimension error using Monte Carlo method and its experimental verification", 46th International Conference on Electron, Ion and Photon Beam Technology and Nanofabrication, 2002.) Mask errors were also included into the classical process window analysis. (Staf Verhaegen et al., "Analysis of the impact of reticle CD variations on the available process windows for a 100 nm CMOS process", SPIE 4889, 197-208, 2002.). On the layout side, there are several approaches for test patterns which give access to lithography parameters, some of them even suitable for production type masks. (Christopher Ausschnitt, "Distinguishing dose from defocus for in-line lithography control", SPIE 3677, 140-147, 1999) Furthermore "flexible mask specifications" were introduced, where one component is the selection of "hot spot" patterns for mask quality assessment. (Shigeki Nojima et al., "Flexible mask specifications", SPIE 4754, 33-42, 2002.)

From the early development phase up to the production phase, test patterns play a key role for microlithography. The roles for test patterns is to represent the design well and to cover the space of all process conditions, e.g. to investigate the full process window and all other process parameters. However, the prior-art test patterns do not address these roles sufficiently.

In the prior art, test patterns are designed by hand, and they explore the geometry domain. However, some of the critical parameters are not well defined at the early design stages. Therefore, there is a significant need for a more comprehensive method for definition of test patterns.

BRIEF DESCRIPTION OF THE DRAWINGS

FIG. 1A is a graph showing deviations due to two process parameter, and selection of extremal points at the hull of the process space.

DESCRIPTION

U.S. Provisional Patent Application No. 60/548,488, filed Feb. 26, 2004 is incorporated by reference, as though set forth in its entirety herein.

A systematic, automated, simulator based exploration of the printability domain is provided. A method which completes the coverage of process parameters going from design to silicon could aid in manufacturing current and future technology IC's. A method which can identify which patterns are the ones to look at for tuning the lithography conditions, or for optimizing the layout, would be very useful. As used herein, the term pattern is not limited to all of the material printed on an entire chip or cell, but can also refer to a coordinate plus the surrounding region. Similarly, it is desirable to know about critical spots during process characterization and during design flow considerations, like optical proximity correction (OPC), and mask data preparation (MDP). When the stage of mass production is reached, a sensitive process monitor is desired. A method which can identify which structures of the final layout are most sensitive to process variations is also desirable for maintaining high yield. An example is described herein that can be used for achieving any or all of these tasks.

A methodology is described herein which may be used to analyze an existing layout (e.g. cell libraries, test pattern or fall chip) for critical layout situations where either limited or no process data are available. This method is referred to herein as, "process space decomposition" (PSD), because it is aimed at decomposing the process impact upon a layout feature into a sum of single independent contributions, which reveal the "dimensions" of the process space. This is a generalization of the classical process window, which examines defocus and exposure dependency of a given test pattern, e.g. the critical dimension (CD) value of dense and isolated lines. The process space additionally includes the dimensions: resist effects, etch effects, mask error and misalignment, which describe the deviation of the printed silicon pattern from its target. The process space is further extended by the pattern space using a product-based layout (cell library, fall chip layout, or synthetic test pattern). The criticality of a pattern is defined by its deviation due to aerial image, its sensitivity to the respective dimension or several combinations of these factors.

Figure 14:
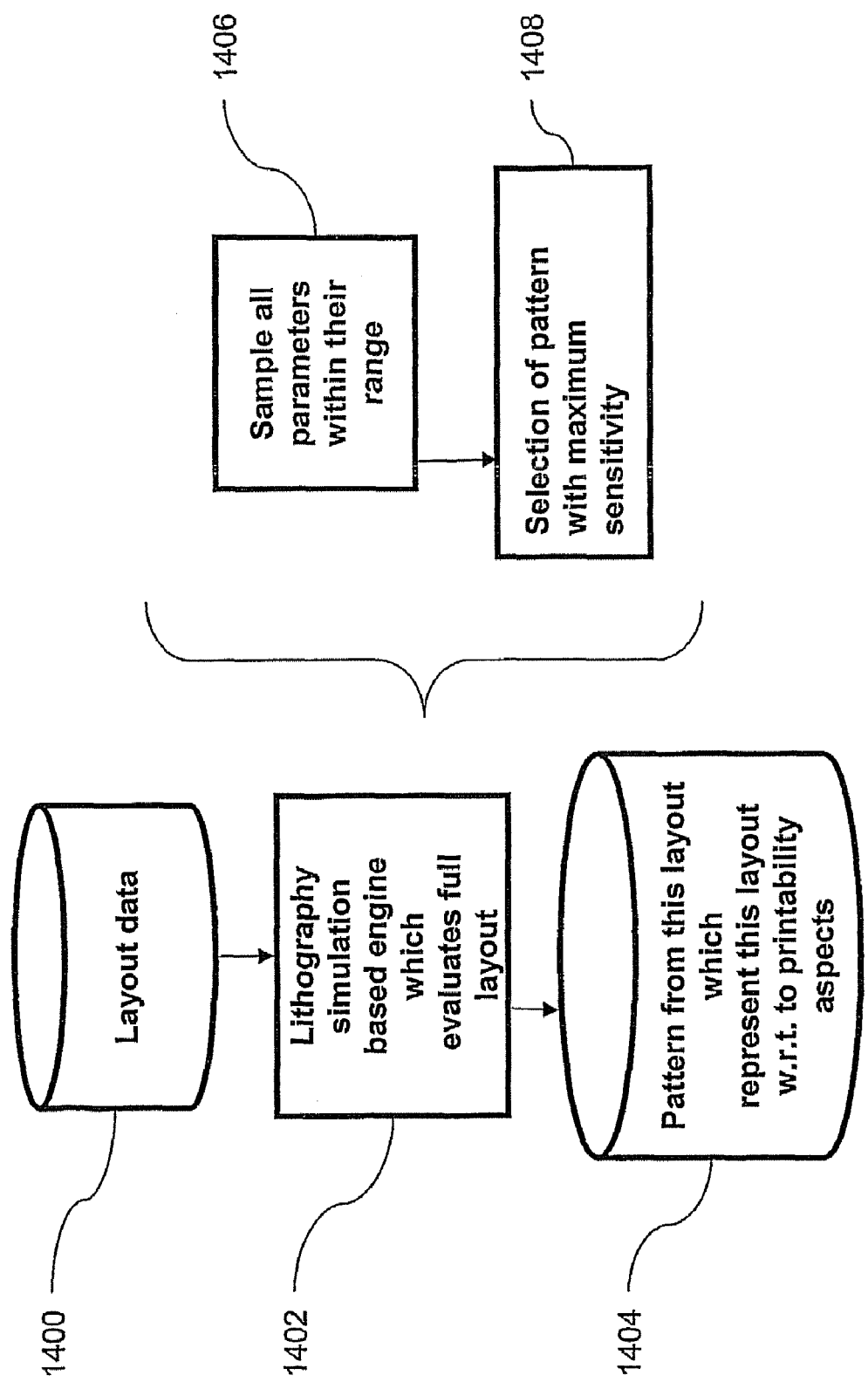
FIG. 14 is a block diagram of a system for automatically generating a set of test patterns.

FIG. 14 is a block diagram of a system for analyzing the printability domain. The system systematically derives test patterns usable to determine whether the parameters of a process are within their acceptable ranges.

Block 1400 is a set of input data for the system (for example, an IC layout based on combinations of cells from a standard GDSII cell library may be used).

Block 1402 is a lithography simulation based engine which evaluates the full layout, and determines deviations of each line of the simulated printed layout from the corresponding desired line in the input data (IC layout). Block 1402 in turn includes two components, shown by blocks 1406 and 1408.

Block 1406 is a means for sampling all process parameters within their respective ranges. The sensitivity of each of the patterns is evaluated.

At block 1408, the patterns with the maximum sensitivity (i.e., the patterns on the hull or boundary of the process space) are selected, to be used for characterizing the process.

Figure 15:
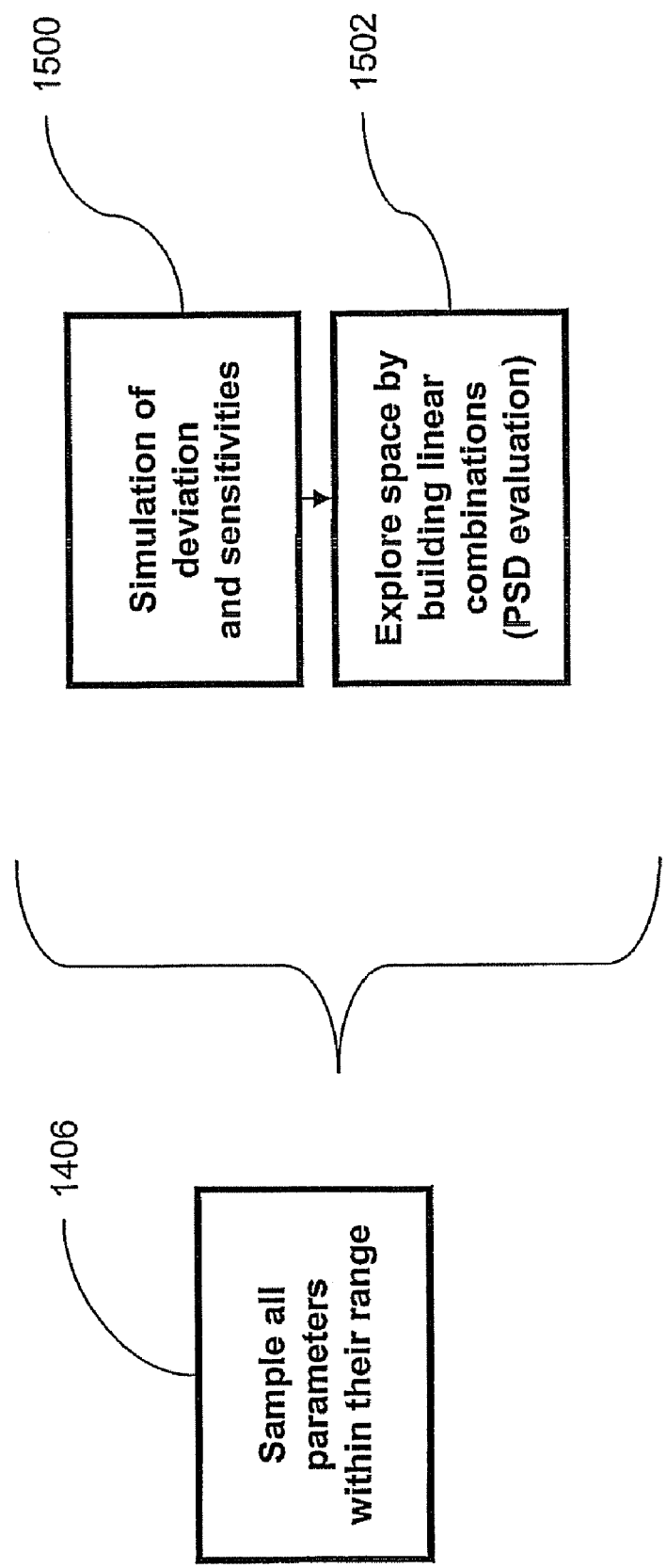
FIG. 15 shows a detail of FIG. 14.

FIG. 15 shows that block 1406 includes two functions, shown in blocks 1500 and 1502. This shows how the method replaces sampling by linearization of the model and building linear combinations.

Block 1500 includes simulation of the deviations and sensitivities for each pattern. This includes at least two different parameter values for each process parameter, for each pattern. With two values for a parameter, the simulation provides sufficient information to generate a linear model of the effect of that parameter on that pattern.

Block 1502 includes a function for exploring the process space by building linear combinations of the deviations from the various parameter effects (referred to herein as the process space decomposition, or PSD, evaluation). This function can automatically find the patterns that lie on the hull of the process space (i.e., the patterns that are most sensitive to some combination of one or more of the processing parameter values), as discussed in detail further below.

Figure 16:
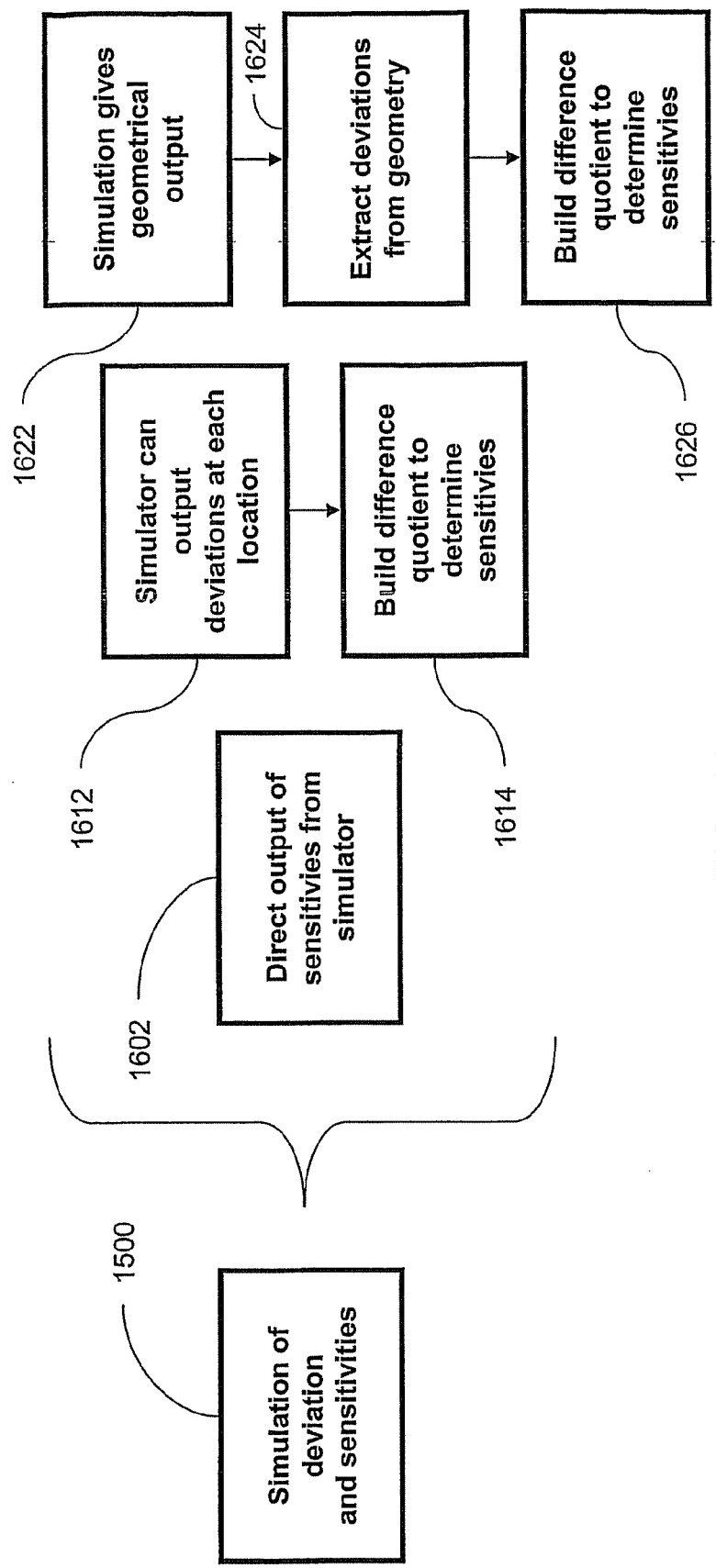
FIG. 16 shows a detail of FIG. 15.

FIG. 16 shows three alternatives for providing the functionality of block 1500. The choice of which alternative to use primarily depends on the type of data output by the simulator that is used.

At block 1602, if the simulator directly outputs the sensitivities of the IC layout to each process parameter, those sensitivities maybe used.

Blocks 1612 and 1614 provide an alternative solution for a simulator that provides deviations, but not sensitivities. At block 1612, the simulator outputs the deviations at each location in the IC layout.

At block 1614, one can build a difference quotient to determine the sensitivities of each pattern to variation of each processing parameter. For example, to obtain a linear sensitivity model, a difference quotient can be obtained from the deviations of two data points for each process parameter.

Blocks 1622, 1624 and 1626 provide a third alternative, to be used if the simulator merely outputs the simulated layout pattern locations. At block 1622, the simulator outputs a geometrical description of the printed pattern under a given set of process parameter values.

In block 1624, the deviations are extracted from the geometry. This can be done by determining a Euclidean distance between each point of interest in the IC layout data and the corresponding output point identified by the simulation.

In block 1626, one can build the difference quotient to determine sensitivities, based on as few as two points per parameter.

By exploring the process space for a given design, the method allows one to find the most critical patterns independent of specific process parameters. Examples are provided below for different applications of the method: (1) selection of design oriented test patterns for lithography development (2) test pattern reduction in process characterization (3) verification/optimization of printability and performance of post processing procedures (e.g., OPC) (4) creation of a sensitive process monitor.

In an exemplary embodiment, costly simulator time is effectively used for a minimal number of calculations (deviations and single sensitivities). After that, the task of "combining all parameters" is done in a "PSD evaluation" step. For each step: (1) The simulator extracts the sensitivity for each single parameter and for all locations in the layout; and (2) The subsequent PSD evaluation integrates these single sensitivities in order to explore all possible parameter combinations at all layout locations. Then, the method determines the layout artifacts which are most sensitive to parameter combinations.

Thus, test patterns are derived in a systematic way. They are optimized in the printability domain, taking parameter uncertainty into consideration by looking at a range of values for each parameter. This method replaces the sampling of all combinations in the simulator with the two step approach, using a simulator linearization method, and by exploring the parameter combination through linear combinations. A selection strategy of the test patterns according to their lithography response (taking extreme responses, respectively, i.e., the "hull" of the sensitivity domain).

A process can be considered acceptable, if all allowed patterns are printing within defined tolerances under a range of variable parameters, such as exposure and defocus, mask error, resist effect, or etch effect. Such a consideration of ranges of parameters adds robustness with regard to statistical variations of the process. Moreover, the consideration of parameter ranges is a necessity if the values of such parameters are not known, and it can be used to overcome the need for measurement data, and to eliminate the costly parameter calibration step. It is clearly not viable to test every pattern and parameter combination. Therefore, it is desirable to determine a set of patterns which is as small as possible, and which is sufficient to test the performance of the full pattern set under various parameter settings. A systematic approach for this selection is described below. One element of the method is to look at extremal values, i.e. to find a pattern where measurement response to some effect is the highest or to find patterns which are the most critical ones for single or combined effects. With this concept, the process space is the space which is spanned by the range of process parameter and the set of allowed patterns.

Figure 11:
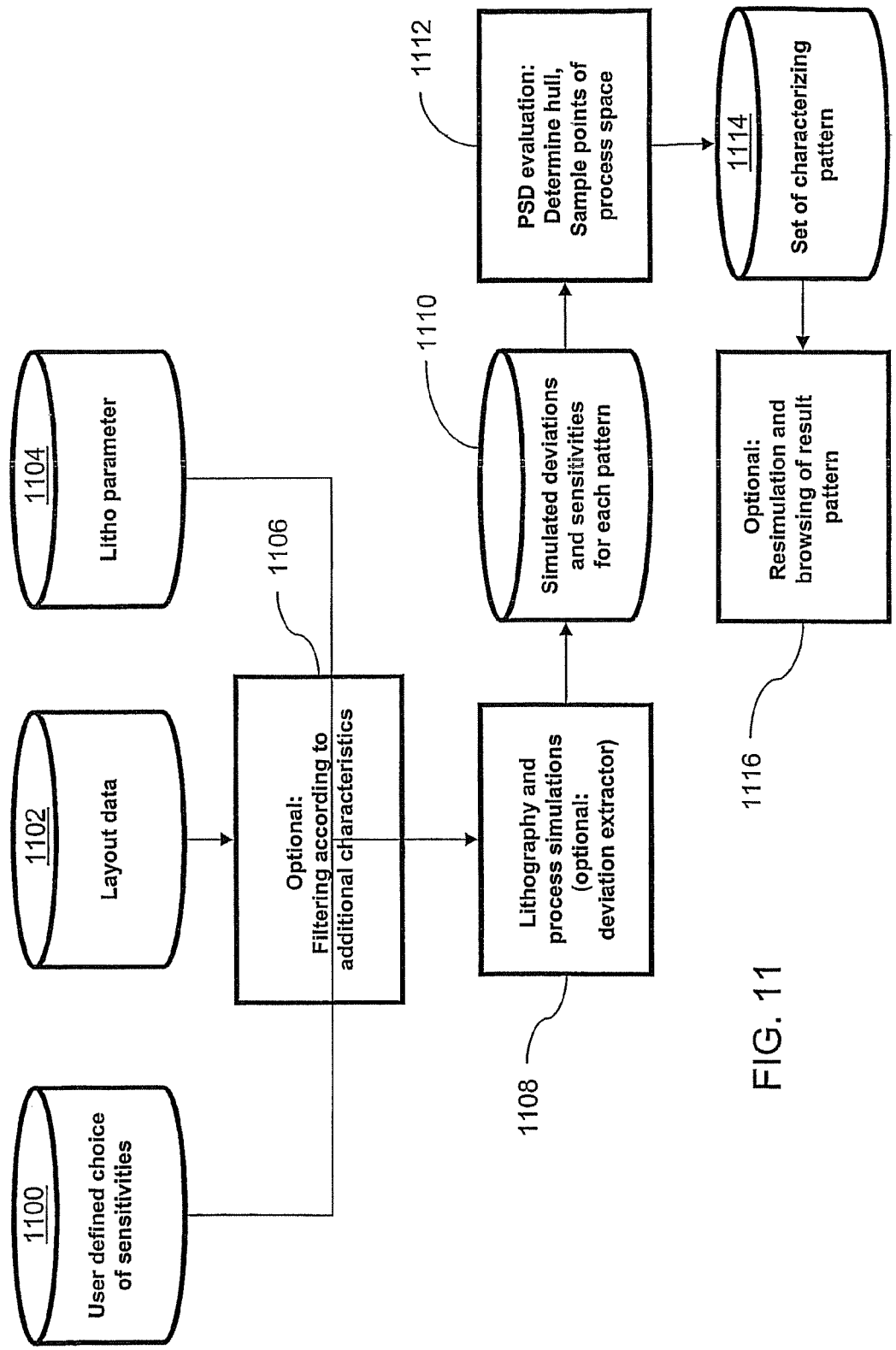
FIG. 11 is a block diagram of an exemplary method according to the invention.

FIG. 11 is a high level block diagram of the PSD method summarized above. Details of each individual block are provided further below.

The input data include the user defined choice of sensitivities 1100, layout data 1102, and lithographic (processing) parameters 1104. The choice of sensitivities includes the selection of dimensions of the process space. The selection defines a set of priorities from the user. The litho parameters may include, for example, lambda, numerical aperture (NA), coherency, and/or mask phase information.

Block 1106 shows an optional step of filtering according to additional characteristics. The filtering may be used in cases where one is not interested in deviations of all segments from their target positions. Patterns that may be filtered include, but are not limited to line-end type patterns poly-over active patterns, non-redundant vias, patterns with a certain width and/or spacing, or combinations thereof.

At step 1108, a lithography simulator and deviation extractor is run, and deviations are extracted.

At block 1110, Simulated deviations and sensitivities for each pattern are output from the simulator.

At block 1112, the PSD evaluation determines the hull points, and optionally additional sample points of the process space.

At block 1114, the hull points determine the optimal set of characterizing patterns.

At block 1116, the simulation is optionally repeated and the result pattern examined.

2. Process Parameter Set

A principle of the "process space decomposition" (PSD) method is to partition the impact of processing a design into silicon (including lithography) into a sum of single independent contributions, the "dimensions" of the process space at block 1110. A well known example of this concept is the classical "process window" using a decomposition into exposure and defocus effects. Any of these dimensions describes the deviation of the printed wafer pattern from a target due to the respective effect. In this approach the following dimensions are defined:

Deviation due to aerial image (AI)
Deviation due to exposure variation (TH)
Deviation due to defocus variation (DEF)
Deviation due to resist effects (RES)
Deviation due to etch effects (ETCH)
Deviation due to mask error (MEF)
Deviation due to misalignment (MA)

This methodology allows the user to define the choice of sensitivities, so that the parameters and parameter ranges which play a role in the analysis can be specified. Exemplary sensitivity sets include, but are not limited to:

(a) Exposure, defocus (process window);

(b) Exposure, defocus, mask error, misalignment in x-direction, misalignment in y-direction; or (c) Exposure, defocus, aberrations, short range resist effect, medium range etch effect.

The user determines the parameters in which he or she is most interested. This takes advantage of the user's knowledge of certain problems, such as focus or misalignment.

The range should be selected so as to give valid simulation results. Because the method looks at the extreme points, the result does not depend on high accuracy of values within the range of interest.

As discussed herein, the term, "litho parameter" (step 1104) may include, for example, lambda, numerical aperture (NA), coherency, and/or mask phase information. Typically, these parameters may be fixed, so that there is no need to select a parameter range for them. One of ordinary skill can easily update the model to reflect different values for these parameters if they change, or to accommodate a system in which they are variable. Within the framework and architecture described herein, the litho parameter ranges can be accommodated by considering one or more of these parameters as "user defined choice of sensitivities," if the litho parameters are independent of the other sensitivities, and if their maximum/minimum values result in extremal answers. Otherwise, the litho parameters can be accommodated by a sampling strategy (e.g., test all parameter combinations).

Aerial image formation is a complex mechanism where the optical parameters are not acting independently. This makes it difficult to extract different contributions. But fortunately, there is actually no need for such a decomposition because its principles are well understood. The remaining parameters normally have a monotonic behavior, i.e. a pattern that shrinks due to defocus will get smaller for higher defocus values, and a line widened by a mask error will get larger if the deviations on the mask are larger, and so on.

Deviation here is a rather generic concept. The simplest way to determine a deviation is to look for the change of the position of an edge due to the different effects. An example for such a deviation would be corner rounding. This may be extended according to what effect is under consideration, and deviation may be defined as a more complicated measurement result such as the deviation of CD from nominal CD or as a two dimensional measurement result such as the quantification of misalignment, where one looks for the overlap area of a contact and a line running across it.

Figure 12:
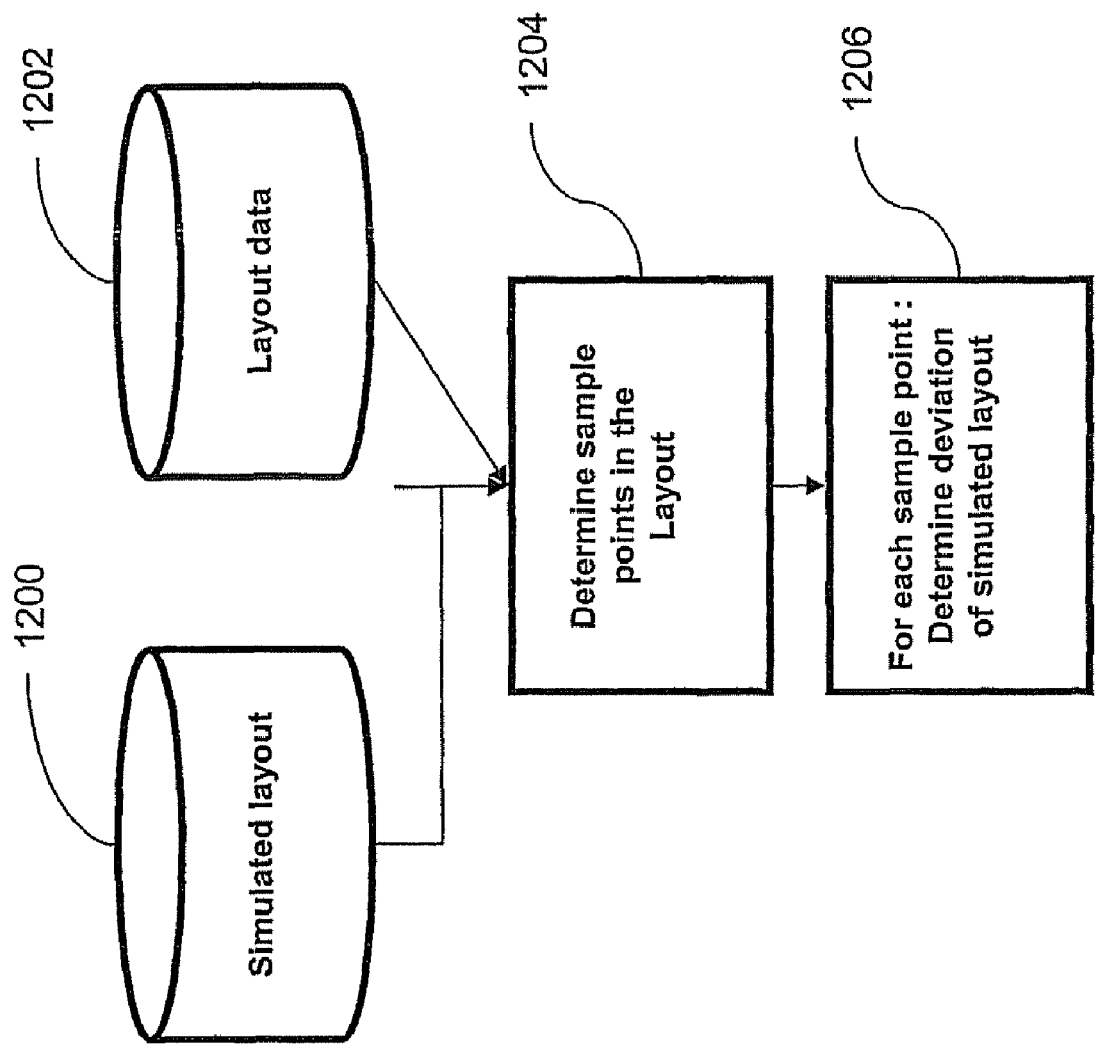
FIG. 12 is a block diagram of a deviation extractor which may be used in the system of FIG. 11.

FIG. 12 is a block diagram showing the deviation extractor. In FIG. 12, a deviation may be, for example, the distance from a simulated edge to a sampling point, a CD of a simulated line at a sampling point, or an overlay area of the simulation at a sampling point (for example the area of line end simulation overlap over the simulated via area). At block 1202, the nominal layout data (e.g., from the cell library) are provided. At block 1200, simulated layout point data are provided. The simulator provides these data based on the nominal layout and the processing parameters. At block 1202, a plurality of sample points are selected. At step 1206, For each sample point the deviation of the simulated layout is determined. The details of these steps are discussed below.

Modeling of Deviations

A linear model is defined below. At each point (x,y), define a continuous function DEV which denotes the deviation from a target pattern:

$$DEV = a \cdot DEV(AI) + b \cdot DEV(RES) + c \cdot DEV(ETCH) + \\ d \cdot DEV(TH) + e \cdot DEV(DEF) + f \cdot DEV(MEF) + g \cdot DEV(MA) \quad (1)$$

Each deviation DEV (dimension) is determined using one lithography simulation for the respective effect. DEV (AI) is determined for each location in the layout by doing just an aerial image simulation for best exposure and no defocus, without mask error. Any other simulation is based also on an aerial image simulation and the respective deviation is calculated relative to the nominal aerial image simulation. Using the example of resist effects, first calculate the deviation with respect to the target just due to the aerial image:

$$DEV(AI) = x_{target} - x_{actual_1} \quad (2)$$

Doing a simulation including resist effects afterwards—applying a reasonable process model—calculate the deviation due to resist effects as:

$$DEV(RES) = x_{actual_2} - DEV(AI) \quad (3)$$

The simulator is preferably a full featured two dimensional optical simulator, based on parameters such as wavelength, numerical aperture (NA), and coherency factor. Additionally, the simulator can be capable of handling defocus, high NA effects, phase masks/double exposure, aberrations, and can have a resist/etch model. An exemplary simulator is "OPTISSIMO™", which is used to optimize the layout of a design to minimize the impact of wafer printing variations due to optical proximity effects. "OPTISSIMO™" software can be used for model based OPC. Any other layout simulator could be used as long as it can measure (i.e., simulate) and output deviations at the various locations in the layout.

In some embodiments, the sensitivities are determined by building the difference quotient from the deviations. That is, the simulator outputs the deviations corresponding to two different values of a parameter, and these two points are used to determine a linear equation modeling the deviation as a function of that parameter. In other embodiments, the direct use of sensitivities provided by the simulator would be also possible. Alternatively, if a simulator is used that does not provide deviation output, a subsequent step could be used to extract deviations from a geometrical representation of the aerial image.

For running the simulations, parameters are derived from extremal values for each effect, i.e., the maximum allowed defocus for the defocus simulation or the upper exposure setting for the threshold simulation and so on. If such a specification does not exist, parameters are chosen which cause a certain amount of effect, e.g. like 5% CD variation relative to the target CD in a relevant dense line pattern.

Interpretation of the Coefficients

In one embodiment, the coefficients a . . . g can be used to switch on and off the respective deviations by setting them to 0 or 1. For example (a,b,c,d,e,f,g)=(1,0,0,1,0,0,0) specifies the deviation from having a different exposure setting, whereas (a,b,c,d,e,f,g)=(0,0,0,1,0,0,0) would specify the sensitivity to different exposure settings. Due to the monotonic behavior of the parameters, equation (1) also allows one to access intermediate values, e.g. (a,b,c,d,e,f,g)=(1,0,0,0,0.5,0,0) specifies the deviation for a certain weaker defocus value (but not a half defocus effect because the relationship is not linear). One can also use the model to reflect changes in the settings. As an example, (a,b,c,d,e,f,g)=(1,0,0,2,0,0,0) would give the deviation if the exposure margin has been increased or if sensitivity to exposure has grown. Negative values can be used to model an opposite trend, i.e. if (a,b,c,d,e,f,g)=(1,0,0, 0,0,1,0) is the deviation from a mask oversize, (a,b,c,d,e,f,g)= (1,0,0,0,0,−1,0) would model the deviation from an undersize.

The linear combinations also help to overcome the problem that certain parameters or sensitivities are not exactly known, either, because it is during early litho development, or because measurements are missing, or because they vary in the process.

This can be expressed by varying the coefficients, for example choosing 0.5, 1 and 2 to test half the expected effect, the expected effect and a two-times-stronger effect, respectively. By combining two parameters, one can choose the coefficients (1; 2), (1; 1) and (2; 1) to reflect the situation that the influence from one parameter is stronger than from the other. These linear combinations with the subsequent search for the extremal values yield the result that the patterns at the border (hull) of the multi-dimensional process space are picked.

The minimum and maximum coefficients (e.g., 0.5 and 2.0) can be selected based on experience and on the goal that they are used to find the hull points, i.e. they should differ significantly in order to pick out significantly different points.

As a consequence, these coefficients can be used to account for the uncertainty of parameters. Of course, the aerial image is a non-monotonic function. The consequence is that reasonable values for the aerial image coefficient a are 0 to determine sensitivities, or 1 to explore deviations. To examine the influence of different optics (e.g. NA), another simulation must be initiated and an extension of the model may be required. Any choice of a coefficient set seems to be arbitrary at first glance. But for this purpose, the selected test patterns do not depend on the actual values of the amplitude.

Combinations of Effects

One of the key challenges in general is how to cope with a combination of different effects. Traditionally, error budgets are assigned to various contributions. However, it is now widely accepted that fixed error budgets cause an unwarranted loss of degrees of freedom and may preclude more optimal design choices. Instead, it is preferable to focus on and evaluate the features that are consistent with high mask error rate factors, without the need to impose restrictions on the design for the case of the very low mask error rate features. Using the methods for this approach insures that tolerances are met for all combinations in a more efficient and economical way.

Analogous to conventional focus exposure considerations, the independence of the contributions and their monotonic behavior enables one to restrict the experiments to the corners of the respective space. This means that it is sufficient to examine whether the patterns print well for all, or a subset of, the combinations of extremal values of these parameters. Some combinations can even be omitted from consideration. For example, it does not make sense to combine a shrinkage resulting from defocus with a growth from exposure. The only prerequisites of this example of the method are that the dimensions are independent of each other (or can be modeled with reasonable accuracy as being independent) and that the deviations in each dimension behave monotonously (or monotonically).

In other embodiments, this concept can be easily extended for non-monotonic contributions by considering not only minimum and maximum values but all extremal values. Here, the interactions contribute another level of complexity, because looking at such sampling points and evaluating f+g and f−g is not guaranteed to find the maximum. Instead, assume a function f(x) and x can be between 0 and 1. To find max(f(x)), one can restrict to test f(0) and f(1) if f is monotonic and the maximum is found easily. The same is true for combinations: Assume a monotonic g(x). By looking at the maximum and minimum values that f(x)+g(x) or f(x)−g(x) can reach, it is sufficient to look at the minimum and maximum of the four values: f(0)+g(0), f(1)+g(1), f(0)−g(0), f(1)−g(1).

In some embodiments, a simple script may be used which calculates the linear combinations and selects the top entries. One of ordinary skill can readily adapt other implementations to determine the linear combinations of the effects.

Figure 13:
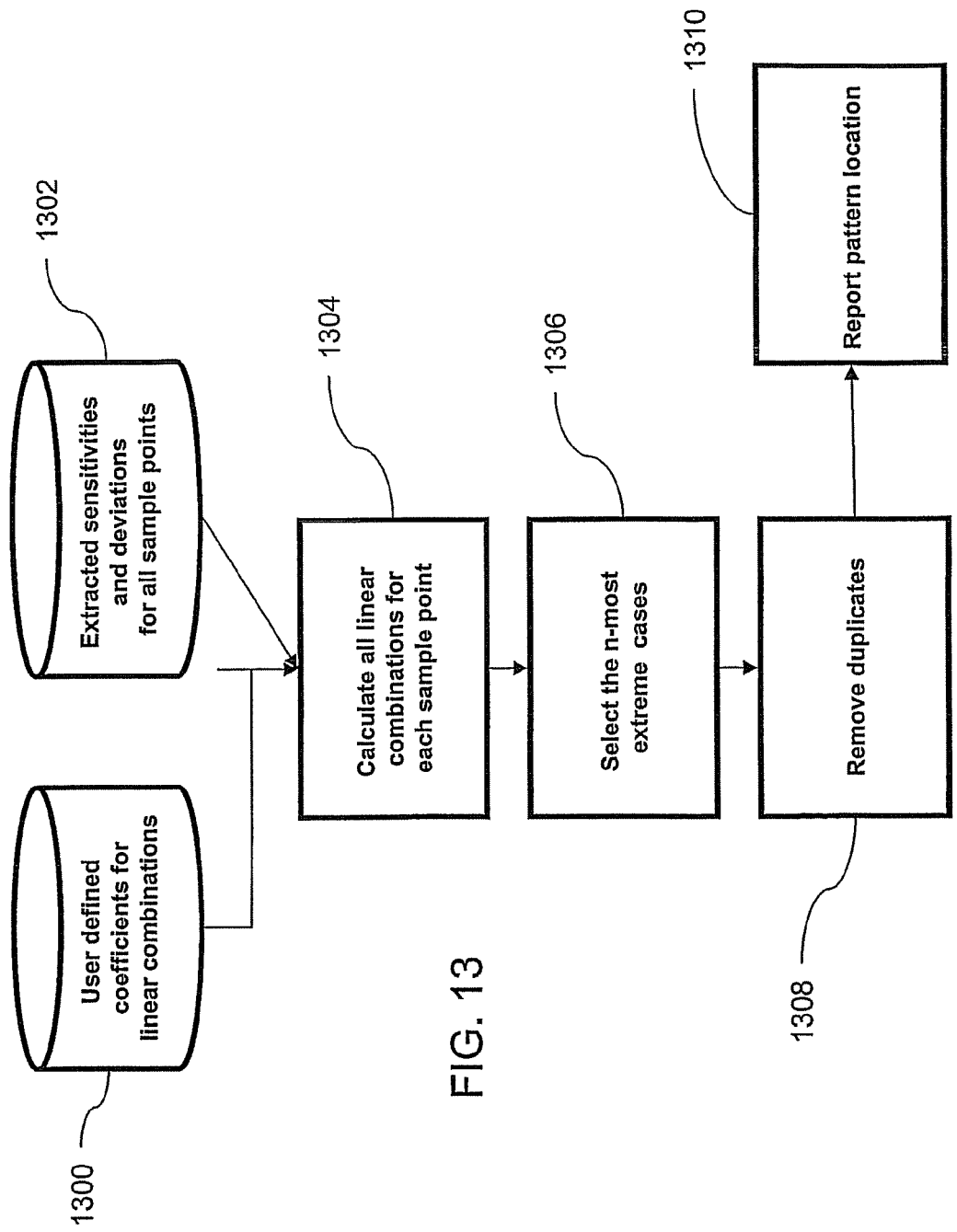
FIG. 13 is a block diagram of the PSD evaluation function.

FIG. 13 is a block diagram of an exemplary embodiment of a PSD process. The steps shown in FIG. 13 are done for each pattern type. In case of several process space sample points, this is done for each sample point.

At block 1300, user defined coefficients are provided for linear combinations of the effects.

At block 1302, the extracted sensitivities and deviations are output by the simulation for all sample points.

At block 1304, all desired linear combinations for each sample point are calculated, using the user defined coefficients.

At step 1306, a predetermined number n of the extremal cases are selected. The extreme cases are the maximum and minimum points within the sample space lying along selected lines that correspond to the user defined coefficients.

Although the exemplary embodiments model each effect as independent of the others (i.e., cross terms are ignored in the deviation calculations), in other embodiments, the cross terms and/or higher order terms can be used in the flow in general, by the above approach, i.e. 1) calculate them and 2) assign coefficients to them. It will be understood that the incorporation of cross-terms and higher order terms into the calculations increases the CPU time, but such efforts and their results may, in some cases, prove to be economically justified.

If f is more complex (e.g., if f has several local maxima), this may not be sufficient and one can sample on a fine enough grid to find the possible values of f. However, this sampling should only be performed for as few parameters as possible in order to minimize the computation time.

3. Set of Allowed Layout Patterns

In order to overcome the possibility that synthetic test patterns might not represent the actual layouts well in some cases, one can extensively vary the parameters of the synthetic test patterns and, in addition, use real layouts. These layouts can be shrunken versions of a library from a previous technology generation, a current library, some regions of interest from a product, or a real full chip product layout.

In addition, filtering techniques may be applied to the patterns. In many cases one is not interested in deviations of all segments from their target positions. Some locations may be more interesting and critical than others. As an example, corner rounding at an inner corner may show the largest deviation, but this feature may not be critical, whereas, for example, a small gate length deviation could be much more critical.

Examples of additional characteristics for which optional filtering may be applied include:

line-end type patterns poly-over active patterns non-redundant vias patterns with a certain width and/or spacing Further, any combinations of the above characteristics may be filtered, such as, for example, line-ends of a certain width that have a non-redundant via on top of them.

In some embodiments, additional characteristics derived from the patterns, such as line end or corner are used for differentiation. Here, differentiation relates to the optional filtering with pattern types. The layout is segmented and each segment may be assigned a certain type. Types may include, for example: line ends, corners, and/or lines. The whole process can be performed for each pattern type separately. So, in one example, the method may show that the line-ends with the highest shrinkage amount are due to defocus, whereas the lines in which the CD varies the most are due to under exposure variation and mask errors.

In some embodiments, additional characteristics, derived from other layers, such as poly over active, line-ends near vias/contacts, are used for differentiation (filtering). One can determine regions of interest, such that no computation is done for locations outside of these regions. The regions would be known and user defined before the method is performed. One non-limiting example would be poly over active, which allows specific results to be obtained only for transistors and not for poly routing. Similarly, line-end shorting is only a problem if the line end does not connect to its respective via anymore. Therefore, it is useful to perform a preprocessing which first determines those line ends near vias, so that only these cases are considered in the line-end shorting analysis.

In some embodiments, additional electrical or connectivity characteristics, such as transistor performance or via redundancy are used for differentiation (filtering). For example a transistor undergoes a geometrical filtering operation which first creates regions for a certain transistor CD. This region is then used as region of interest. Similarly, one can define geometrical regions for non-redundant vias and then use them as 'region of interest'. Except for the choice of the pattern types, all the filtering operations can be performed by commercially available standard layout processing tools.

The evaluation uses simple linear combinations to put the single sensitivities together. It is up to the user to perform filtering and select a subset of the mathematically possible combinations to form a set of reasonable linear combinations. The choice of linear combinations needs some knowledge of the technology. Some examples:

Coefficients for exposure should be positive, zero, negative to reflect overexposure, nominal point and underexposure.

Defocus has for some litho conditions a symmetrical effect, i.e. a negative defocus has the same meaning as a positive defocus. So, zero and positive coefficients can be considered, in such cases, without considering the negative coefficients.

If it is desired to assess the case of image shrinking, only process combinations which trigger shrinking are useful, An example for this case is underexposure plus defocus. Overexposure does not need to be considered because it certainly will not result in shrinking patterns. One subdivides segments of drawn polygons into different classes which can aid in detecting the relevant critical locations. For example, one distinguishes between segments in the middle of a line (LINE) and at the end of a line and at corner locations. Being interested in the resistance of long poly layer lines one would look for such LINE segments only in the analysis. One also looks at neighborhood effects as a candidate for filtering, since, for example, bridging is only likely if there are close neighbors. As another example, opens are more likely to occur at thin lines.

Additionally, filters according to multilayer interactions are applied, such as looking only at CD for regions of poly over active layer or looking only at line ends in the vicinity of vias.

The linear model described above has several advantages, including:

Effects can compensate for and amplify each other. For example, a mask widening and an overexposure will both contribute to the result. But they do this only as a sum and not as the potentially complex function.

The linear model looks at ranges and it is not necessary to know exact values. Therefore, for this approach, the omission of cross-terms and higher order terms does not result in significant loss of the salient extrema data points.

The model looks at extreme answers: If the linear model calculation shows that a pattern has the biggest response to mask widening plus over exposure, it is quite likely that a more accurate model would show the same qualitative result—even if the absolute quantity of the response might differ.

A resimulation step with manual inspection is provided at the end of the process. This prevents the method from giving misleading results.

EXAMPLES

4. Bringing Process Parameter Set and Pattern Set Together

In the sections above, the process parameter set and the pattern set are reduced. However, combining every element of one set with every element of the other set would be prohibitive. Therefore, configurations which result in extremal values are considered. FIG. 1A illustrates this method.

FIG. 1A shows an example of a two dimensional representation of the process space. Each dot represents a different layout situation. The rectangles represent the corners (extremal values) of the process parameter space. These corners provide an extrema map, i.e., a representation of the hull of the process space.

FIG. 1A shows only two dimensions of the process space, aerial image and defocus. Each element of the layout pattern set gives a separate entry depicted as a small dot, the location on the x-axis is determined by the deviation resulting from aerial image. The location on the y axis shows how the pattern reacts to defocus variation. Pictures of the corresponding layout are shown at some dots. The majority of the layout patterns are situated in the middle. One can achieve a big reduction of the pattern set by selecting only the patterns which define the hull of the pattern set. An example of this hull is shown in hollow squares. The points on the hull define a subset of features of a mask having the highest error rates, derived from the layout data.

In this example, as few as five patterns can represent a full layout with regard to its worst case behaviors for various combinations of aerial image and defocus effects. FIG. 1A also shows the advantage of layout filtering: The layout spots of this example are of different types (within the line, at the corner, etc.), which results in very different regions in the plot. For real applications, one looks at several dimensions at once and applies the filtering techniques mentioned above. This typically results in a set of 10-100 test patterns. For example, some embodiments provide 20 test patterns. The motivation for selecting patterns from the hull is the assumption that patterns in the middle of the process space will print well if the hull patterns print well. Generally, patterns from the inner part will have less sensitivity to changes of a certain dimension than patterns at the hull. If these patterns are also of interest, one can apply a sampling approach over the process space plot. Contrary to the traditional sampling approach of choosing layout patterns with several CD and space settings on the mask, this sampling selects patterns according to the wafer effects of various parameters and is therefore based on a more appropriate space with regard to printability. Note, that backtracking to the contributing layout patterns can be done. This is important in order to be able to judge any measurements from silicon. A test pattern which is failing, or for which the response is out of specification, can be easily mapped onto the suspected root cause of the failure.

Figure 1C:
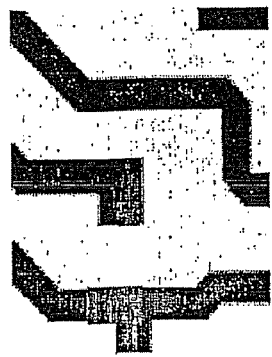
FIGS. 1B to 1E are enlarged details showing the patterns represented by four of the points on the graph of FIG. 1A.
Figure 1E:
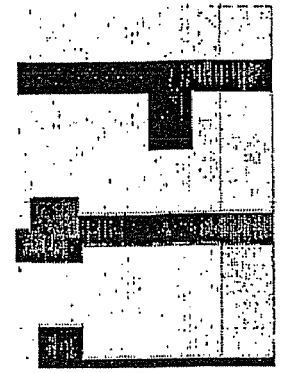
Figure 1B:
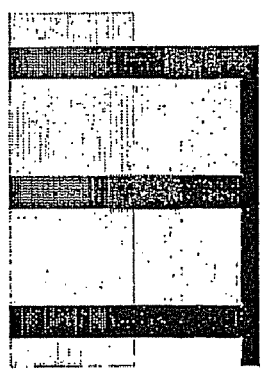
Figure 1D:
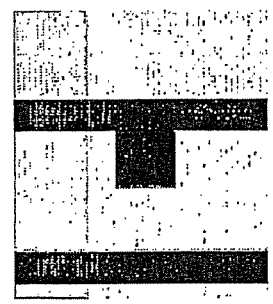

FIGS. 1B to 1E show four patterns for which the respective deviations are represented by points in the extremal squares in FIG. 1A. As apparent from a review of FIGS. 1B to 1E, the procedure of selecting the hull values, as described above, automatically results in selection of a subset containing a variety of patterns that can be used to examine the boundary of the process space. These patterns can be used to evaluate the effects of all the relevant parameters in the process space model, even though the graph of FIG. 1A is only a two-dimensional plot of defocus deviation versus aerial image deviation.

FIGS. 1A to 1E also show that the actual choice of parameters do not play a role. Consider a situation where, for example, the mask CD errors improve and each error at the mask is half the amount. Now, having deviation from mask errors at the y-axis, the dots distribution will have the same shape but they are only compressed in the y-direction. The selected hull patterns for the non-compressed case also form a hull for the compressed case and therefore, they are independent.

The automated tools identify the n-most sensitive artifacts, for example the 100 most extreme points on or very near the hull. In preferred embodiments, the user decides how-many (n) points from the hull or adjacent to the hull to use. The value of n depends on how much space is available on the test chip, how the patterns look—if they are very similar, only one representative might be sufficient—and what application they serve.

In preferred embodiments, the selection of the extremal points is automated. The graph in FIG. 1A displays a representative example of the output of the simulator for a simple 2-dimensional case. FIG. 1A includes boxes showing 5 points that are selected using automated calculations. The PSD evaluation procedure is based on the selection of the hull. In the two dimensional case, there are two values, A and B for each data point. Assume that A is the X coordinate, and B is the y coordinate. To select the leftmost point (in the box labeled FIG. 1D), take the point having the minimum value of (A). The rightmost point (in the box labeled FIG. 1E) is given by the point having the maximum value of A. The bottommost point 50 is the point having the minimum (B) and the topmost points (in the boxes labeled FIGS. 1B and 1C) are the points having the maximum (B), respectively. The point (in the box labeled FIG. 1C) in 45 degree top-right direction is max (A+B). The point (in the box labeled FIG. 1B) at the top-left direction is max (B−A). Thus, in this case, five points on the hull (extreme boundary) of the process space are calculated by the program.

Additional extremal points can be chosen automatically by selecting directions different from the 45 degree line, for example by finding the maximum of (2*A+B). So, for a sufficient number of linear combinations of A and B, one can get the complete hull, or as many points along the hull as are desired. The linear combinations have a meaning: for example, assume A is exposure sensitivity, B is defocus sensitivity and C is the nominal point. Then, C is the nominal point, C+A is overexposure, C−0.5*A is half underexposed, C+A+B is overexposed in defocus. In coefficient vectors, these four situations would be (0,0,1), (1,0,1), (−0.5,0,1), and (1,1,1).

Note that the extremal points are determined by selecting the maximum value of one specific direction (i.e. the linear combinations).

The user should choose the set of linear combinations according to the meaning that they reflect and that will enable the user to find a reasonable hull. Even the coefficient of the nominal point can be chosen as a value of zero (to only look at sensitivity) or 1 (to look at the absolute deviation).

One of ordinary skill in the art will understand that the automated selection procedure described above can readily be extended to any number of dimensions in the process space. Multi-dimension analysis is possible without any extra effort and with low computational effort since the concept of linear combination can easily be extended to several dimensions. As explained above, relevant extremal points from the sample can be identified by simple arithmetic calculations without human intervention.

For the multi-dimensional case, as described above, it may be desirable for the user to filter out those parameters that are of no interest. For example, the user defined choice of the linear combinations determine which points are selected. Some even might not make sense in a particular scenario (for example, if the user is only interested in exploring shrinkage, he does not want to find the whole hull. In general, each layout pattern results in a point. Therefore, one can track the source element down to the resulting point. If this point is selected as a relevant extremal point it directly means that the corresponding pattern in the layout is selected. From the group of determined hull points, duplicates are removed. That is, if two different test patterns provide points that are very close to each other on the plot, it is sufficient to include one of the two types of test patterns on the test wafer, without including the other type of test pattern. Preferably, the user then manually resimulates and inspects every pattern and makes a selection from them.

To account for all types of layout elements, any pattern which is selected and has an extreme answer stands for all other patterns which have the same or similar sensitivities and deviations. So, it is assumed that the other patterns having similar sensitivities might look different but they lithographically behave exactly or substantially the same way. And when they behave the same way, it is acceptable to choose either one as representative of both pattern types.

In some embodiments, the method selects the 100 most extreme points for each 'direction'. This means only one point in a given direction is on the hull, and the others are in its vicinity and are a little towards the inside. The number of interior points that are used is preferably a user defined parameter.

Alternatively, the analysis can use the points in a certain percentile; i.e., the number of points used depends on the number of point oriented along any given direction in the process space, and can be different for each direction. The advantage for the addition of interior points near the hull is that the hull point might be an outlier or might not represent an interesting layout (for any reason whatsoever), and some more points are included, the results might be more meaningful without increasing computational complexity substantially.

APPLICATIONS

The above sections described how to analyze an existing design space (e.g. logic library) for critical patterns. This section provides some examples for which the method is used, and some examples of potential applications. These applications have in common that they benefit from targeted test patterns. Table 1 shows an overview over the application in different technology phases and some of the advantages this method can provide. Table 1 provides a summary of field of activity of the PSD method at different stages of technology development.

The method tracks and stores the layout locations which correspond to the above described extremal values that the method has identified. As noted above, each point (and therefore, each extremal value) represents the deviation of a respective pattern (where pattern is a coordinate plus the surrounding) given a particular vector of parameter values. This enables identification of which pattern is responsible for which response. A few non-limiting examples include:

Pattern A reacts most to underexposure in combination with strong defocus.

Pattern B reacts most to etch in combination with mask error.

Having identified the patterns which have deviations in response to the various parameters, the designer can then feed these results back to implement real changes in the layout and/or in the values of the process parameters.

The user has discretion with respect to how the results are used, depending on the application and the degrees of freedom one has. A few non-limiting examples include:

The patterns are examined, and similar width/spacing values can be implemented on a lines/spaces test pattern.

The patterns themselves may be used as test patterns on a test chip.

The patterns themselves may be used to optimize the OPC scheme.

The patterns may be used to improve the layout, e.g. by changing the cell library.

The lithography parameters may be changed to improve the printing of the patterns.

The examples described below use the "Standard Cell Library for MOSIS TSMC CMOS 0.25 Process" from Tanner Research, Inc., which is available from the web (http://www.mosis.org/Technical/Designsupport/std-cell-library-scmos.html) as an example to demonstrate the process space decomposition method.

The library was shrunken (shrink factor for poly 0.75) leading to 0.18 μm structures in the poly layer. Further modifications were done to increase criticality of the layout (removal of contact enclosures in the poly layer). The lithography conditions were chosen as used in 0.18 μm process: $\lambda=0.248$ μm, NA=0.52, $\sigma=0.6$. "OPTISSIMO®" as used for doing the lithography simulation. (Christoph Dolainsky, Wilhelm Maurer, "Application of a simple resist model to fast optical proximity correction", SPIE 3051, 774ff., 1997) All simulations are for nominal conditions.

1. Early Technology Development

During this phase of technology development one faces the situation that the lithography settings are not yet fixed, measurement data is not yet available and one might not have a final layout, but instead a shrunken library from previous technology node. One is most interested in results about the influence of different stepper settings, reasonable estimates of resist effects, weak points in the layout and effective test patterns regarding lithography and resist effects.

Consider, for example, poly gate lengths of the example library. Software stepper simulations were done for each dimension of the process space and the results analyzed as described.

Here assume that the input design data is also describing the target pattern. One looks for the extremal deviation of poly simulation on top of active. The result of the analysis can

TABLE 1

| Technology phase | Layout available? | Avantage of PSD in layout space | Process data available? | Advantage of PSD in process space |
|---|---|---|---|---|
| Development | No (synthetic test patten + shrink) | Select test patterns, show potential trouble makers | No (assumptions) | Covers a range of conditions, allows to optimize robustness |
| Characterization | Partial (or preliminary) | Reduction of measurement points | Yes (preliminary) | Determine low and high sensitivities |
| Layout manipulation (MDP + OPC) | Yes, full chip | Hot spot detection | Yes | Robustness test (e.g., of OPC) |
| Monitor | Yes | Reduction/selection of relevant test patterns | Yes | Optimized observability | be seen in FIG. 2-7. The figures show active target (light solid), poly target (hollow fill) and poly simulation for nominal condition (solid).

Figure 2:
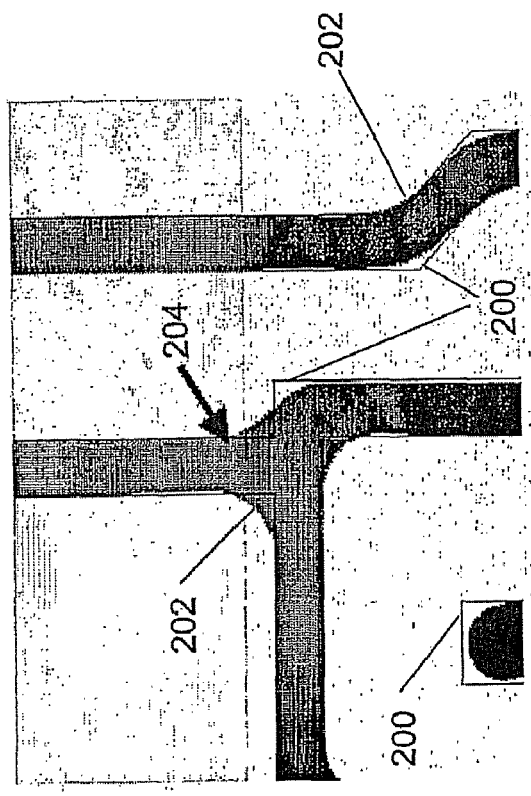
FIG. 2 shows a pattern which has strong effects of corner rounding due to defocus.

FIG. 2 shows a pattern which has strong effects of corner rounding due to defocus. Outline 200 shows the nominal gate line pattern. Pattern 202 is the simulated gate line pattern under the defocus condition. Corner rounding of the polysilicon leads to an increased gate length at the active border. The arrow 204 in FIG. 2 shows the location of maximum deviation. This type of pattern is the one most sensitive to grow due to defocus effects.

Figure 3:
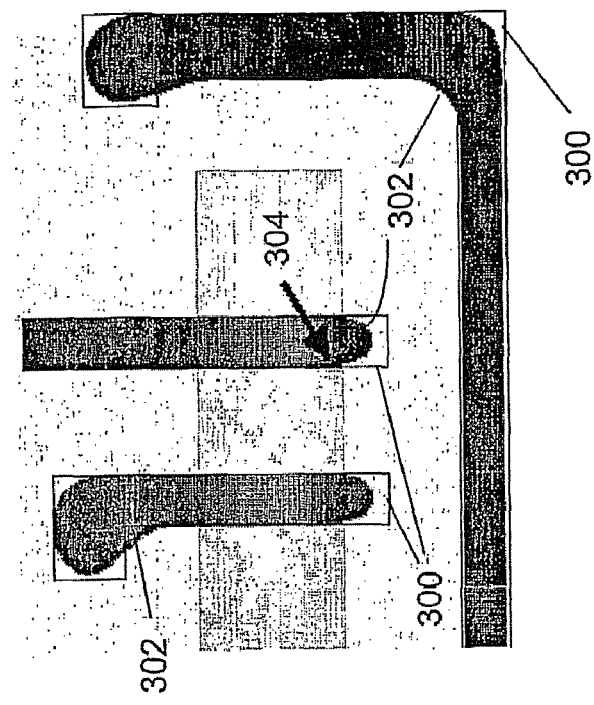
FIG. 3 shows a gate length variation from defocus effect for a line-end pattern type.

The pattern shown in FIG. 3 also shows a gate length variation from defocus effect, but for a line-end pattern type. Outline 300 shows the nominal gate line pattern. Pattern 302 is the simulated gate line pattern under the defocus condition. Line end shortening of the polysilicon leads to a decreased length at the active border. Arrow 304 shows the maximum line end shortening deviation. The simulation is also for defocus condition, but FIG. 3 shows the pattern most sensitive to shrinkage due to defocus effects.

Figure 5:
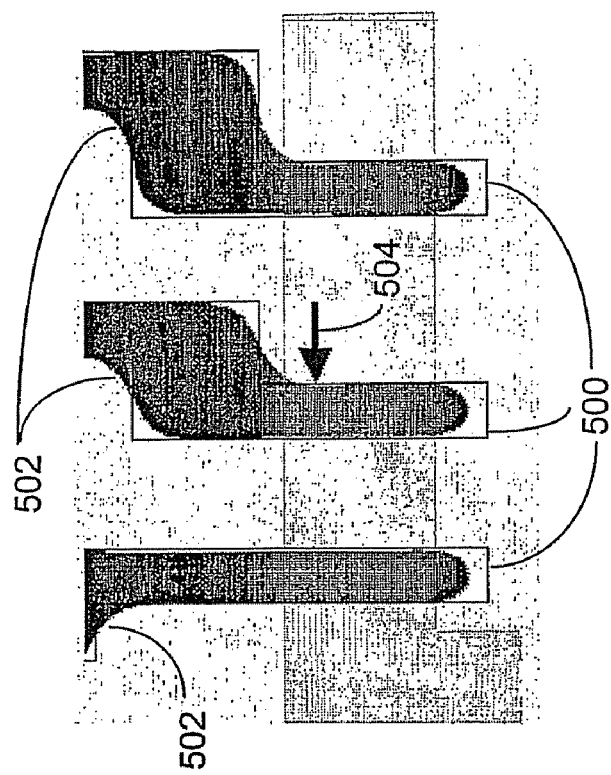
FIGS. 4 and 5 show the locations with maximum sensitivity to optics (aerial image shrinkage).
Figure 4:
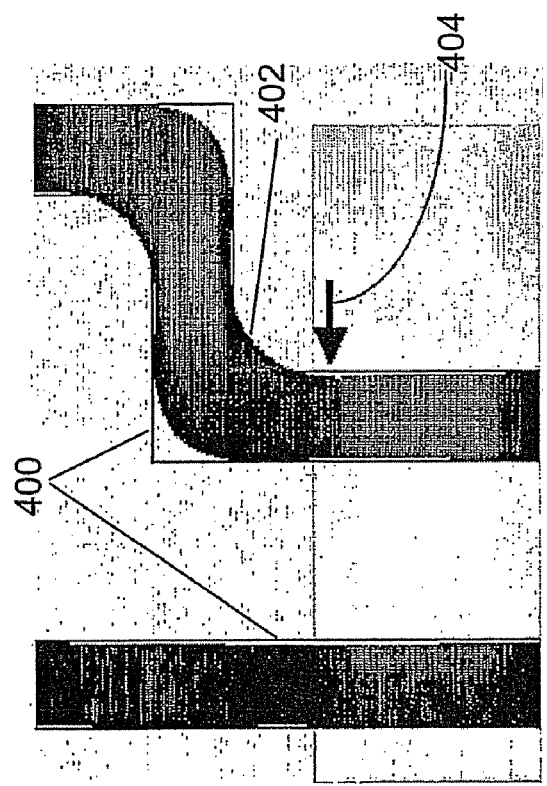

Furthermore one also finds "real" gate length problems in locations more distant from the active border. FIG. 4 and FIG. 5 show the locations with maximum sensitivity to optics (aerial image shrink) and exposure variation. In FIG. 4, outline 400 shows the nominal gate line pattern. Pattern 402 is the simulated gate line pattern under the optics condition. In FIG. 4, the optical conditions (aerial image) lead to a decrease of gate length (maximum shrinkage) at the location shown by the arrow 404. This pattern is the one most sensitive to shrink due to optics.

In FIG. 5, outline 500 shows the nominal gate line pattern. Pattern 502 is the simulated gate line pattern under exposure variation. In FIG. 5, exposure variation leads to a decrease of gate length (maximum shrinkage) at the location shown by the arrow. This pattern is the one most sensitive to exposure variation.

Further, assume that a final resist is not provided yet, or it is not yet characterized. At this stage of process development one might also be interested in getting a reasonable impression of resist effects, which can be expected later.

Figure 7:
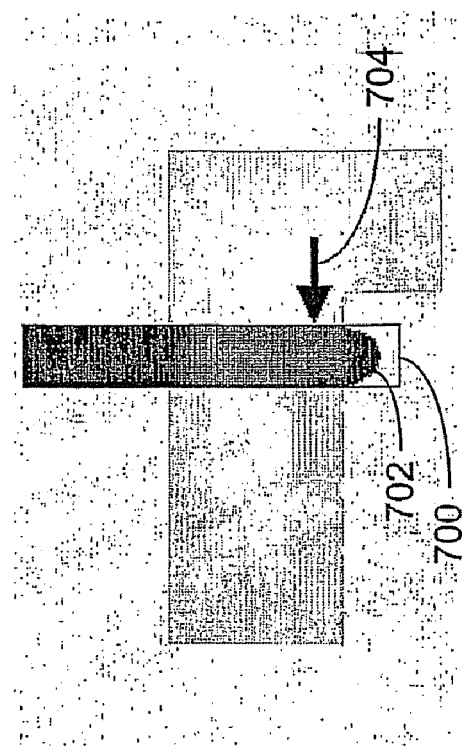
FIG. 7 shows a pattern where gate length decreases using one model and gate length increases using another model.
Figure 6:
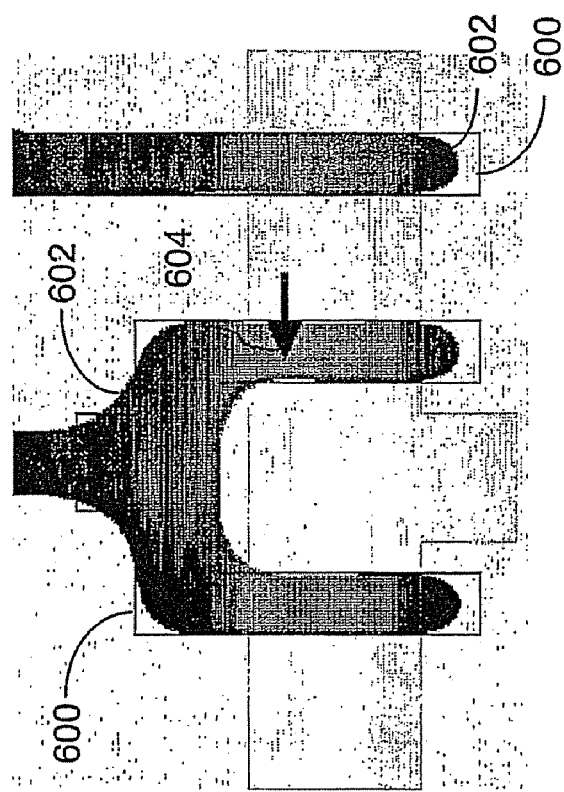
FIG. 6 shows a pattern with a gate length decrease.

In the study two basic process models from OPTISSIMO® were used. Looking for the patterns which show extremal deviation from target due to such resist and etch effects leads to similar results as described above for optical effects. Here the results show one pattern showing gate length decrease (FIG. 6) and one, where gate length decreases using one model and gate length increases using another one (FIG. 7). Therefore, this pattern would be helpful to study resist effects. FIG. 6 shows the pattern showing maximum shrinkage of gate CD with consideration of a resist mode. Outline 600 shows the nominal gate line pattern. Pattern 602 is the simulated gate line pattern under resist effects. The arrow 604 shows the location of maximum shrinkage. In FIG. 7, outline 700 shows the nominal gate line pattern. Pattern 702 is the simulated gate line pattern under resist effects. The pattern 700 shows the maximum sensitivity to resist models.

2. Process Characterization

The requirements for test patterns are challenging during this phase going from process development to process monitoring. On one hand it is desirable to cover the whole relevant design space; on the other hand one may want to restrict the number of test patterns to the minimum number possible to reduce silicon and testing costs. The exemplary approaches can help by selecting patterns that are most sensitive to the effects to be characterized and least sensitive to other effects. Another difference is that synthetic test patterns play a bigger role.

3. Optimization of Layout and Layout Modification

In this phase, where litho and process conditions are fully defined, where a final layout is available and one is going to production, one has strong interests in reliable manufacturability of the respective product. So one will analyze the performance of layout modification procedures like mask data preparation (MDP) or optical proximity correction (OPC). The outcome can be an enhancement of these procedures or even a layout modification, if OPC can't fix the detected problem. Here, OPC usually corrects for one parameter, i.e. the aerial image at nominal conditions. Using PSD on the OPC output, one can get feedback on the deviations originating from the other dimensions.

Figure 9:
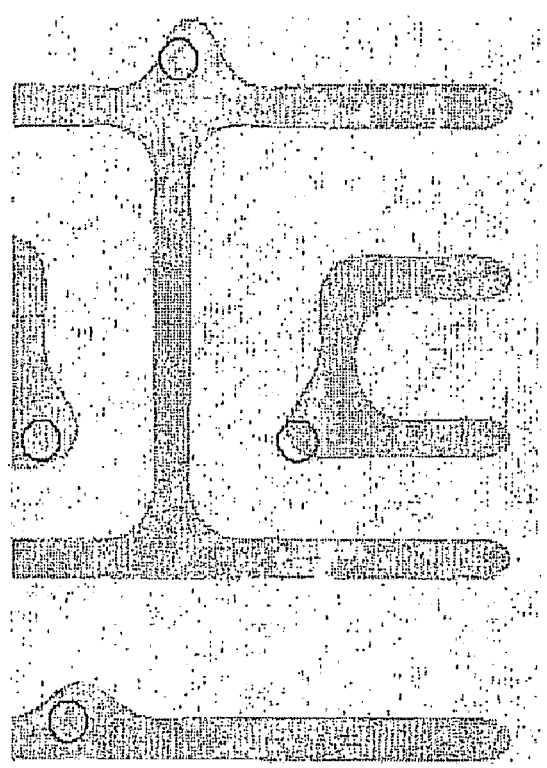
FIGS. 8-10 show the results of combinations parameters, and what patterns result from combining two dimensions.
Figure 8:
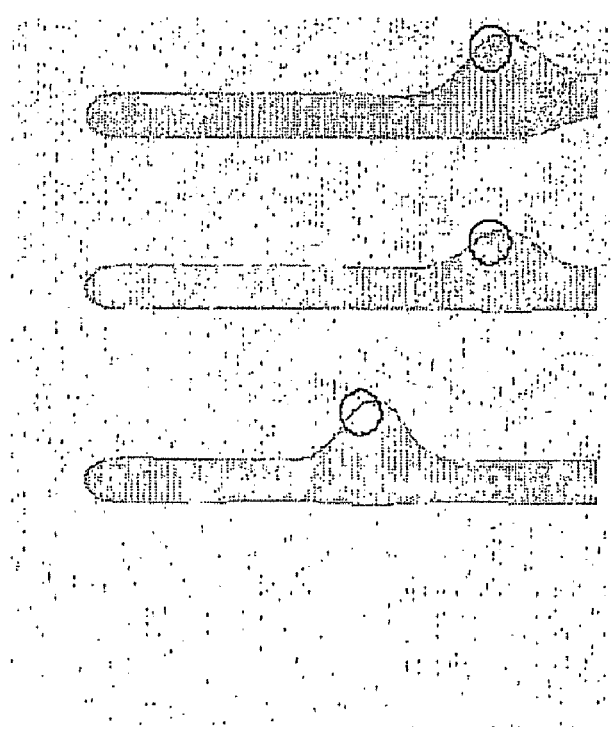
Figure 10:
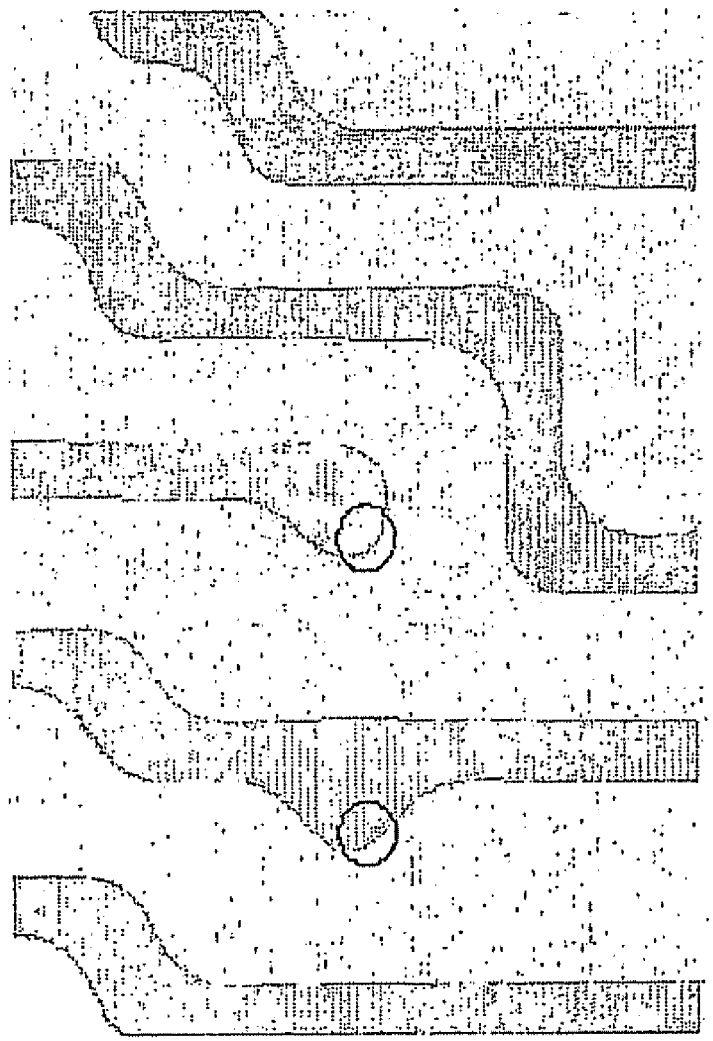

Consider, for example, the overlap between contacts to poly and poly layer. The most appropriate measure is the overlap area, because this is related to the resistance of the contact. The overlap area can change due to two different effects: the area of the contact itself, and the size of the overlap between contact and underlying poly layer. Assume here that OPC is capable of producing contacts of nearly unique size. Then one can concentrate on the second case. To be simple, consider only effects which are caused by changes of the poly layer printed pattern. As described above, one can do a sensitivity study looking for the minimum overlap area for each process space dimension. In order to provide a descriptive example of combinations, consideration is restricted to misalignment effects and the combinations of the single dimensions of misalignment in x and y axis. FIGS. 8-10 show the combinations and what patterns result from combining these two dimensions. The layer mapping is: poly simulation (solid fill) and contact simulation (hollow). FIG. 8 shows the pattern most sensitive to misalignment in positive X and Y directions. The same pattern is most sensitive to misalignment in the positive X and negative Y directions. FIG. 9 shows the pattern most sensitive to misalignment in negative X and positive Y directions. FIG. 10 shows the pattern most sensitive to misalignment in negative X and negative Y directions.

4. Process Monitor

This application is a special case of process characterization. Here the main point of interest is sensitivity regarding process variations. An additional constraint is to have a set of test patterns as small as possible in order to reduce silicon area and test effort. The higher amount of available information, like process window, CD error budget, defined layout and the like makes it easier to more directly target test patterns as appropriate. Here, one may include test patterns covering the design space well and being selectively sensitive to a certain dimension of the process space, e.g. defocus variation. This helps in achieving good observability.

Thus, non-limiting examples of applications include early lithography process development, early library development, process characterization, test pattern design, printability verification, OPC effectiveness verification, and library qualification.

For early lithography process development, uncertain/unknown parameters, ranges are determined. PSD suggest the most important pattern out of a library or a set of test patterns. Litho engineers can then optimize the litho parameters towards the detected problems.

For OPC effectiveness verification, PSD picks the most critical patterns. Manual inspection and a resimulation of these patterns then shows whether OPC handles them correctly.

For Library qualification, PSD extracts the most critical patterns. A manual inspection and resimulation then helps in determining the printability of each library cell.

Other Applications

The method and system described herein provide the possibility of evaluating a layout description with a model which incorporates legacy information. This capability is consistent with the use of legacy tools, such as the "Pdfx™" platform and methodology by PDF Solutions, Inc. of San Jose, Calif. Thus, the approach, if applied to the design of library elements could interact with all the other optimization parameters, e.g. cell size and features that produces modified (enhanced) library elements using the "PdFx™" (or other legacy) methodology.

Another application is that the PSD results of an actual layout could be fed back to effect appropriate design changes (and routing). Thus, the method can be used to improve the printability of either library cells or the layout itself in an automated system. For this application, the tool should output more than just the most important (extreme) layout patterns, in order to give quantitative printability numbers for all cells. Similarly, for automating design changes the designer should know the quality of all areas, and not only the top problem makers. For this purpose, each pattern type in each cell would be represented. For example, the data point representing the most extreme deviation for each pattern type may be investigated, even though some of these data points lie well within the boundary (hull) of the multi-dimensional process space. Architecturally, this feature can be built as an extension to the calculation of the printability quality factor (PQF) which is used as a litho metric within "Pdfx™".

Components

Preferably, the automatic steps include at least the following:

Filtering operations and assignment of pattern types. Filters can be implemented by the layout engines from Hercules/Synopsys, Cats/Synopsys, Calibre/Mentor or Assura/Cadence, for example.

Simulator runs and output of sensitivities. Typical simulators are Calibre/Mentor, Taurus/Synopsys but can also be Prolith/KLA or Solid-C/Sigma-C.

Subsequent selection of hull points.

Re-simulation.

The following automated tools may be included in an exemplary configuration:

An optical simulator may be implemented using a commercially available software package.

Depending on the capabilities of the selected simulator, an additional deviations extractor may be included (see extra diagram)

sensitivity extraction by difference quotient from deviations

PSD evaluation (see diagram)

Browsing and inspection of layout (commercially available). For layout browsing, examples of tools include, but are not limited to, Calibre or Assura.

Summary of the Examples

For the current state of technology, lithography parameter variations are becoming more important. Additionally, layout patterns have an increased effect on layout printability. A systematic method is described above to address these issues by combining parameter space with pattern space for test pattern selection. This method can cope with the resulting huge complexity by filtering and concentrating at extremal points, both in process parameter space and pattern space. This approach is targeted at considering robustness and parameter uncertainty aspects while still being able to run on fall chip layouts. The consideration of parameter uncertainty can be used to overcome the need for measurement data and to render obsolete the tedious parameter calibration step. The method is capable of extracting typically the 10-100 most meaningful layout patterns. By considering just as much information as is available, this approach is suited to serve multiple purposes from the cradle to the grave of a technology.

Other improvements and embodiments are contemplated, consistent with the user priorities.

The present invention may be embodied in the form of computer-implemented processes and apparatus for practicing those processes. The present invention may also be embodied in the form of computer program code embodied in tangible media, such as floppy diskettes, read only memories (ROMs), CD-ROMs, hard drives, ZIP™ disks, memory sticks, or any other computer-readable storage medium, wherein, when the computer program code is loaded into and executed by a computer, the computer becomes an apparatus for practicing the invention. The present invention may also be embodied in the form of computer program code, for example, whether stored in a storage medium, loaded into and/or executed by a computer, or transmitted over some transmission medium, such as over the electrical wiring or cabling, through fiber optics, or via electromagnetic radiation, wherein, when the computer program code is loaded into and executed by a computer, the computer becomes an apparatus for practicing the invention. When implemented on a general-purpose processor, the computer program code segments configure the processor to create specific logic circuits.

Although the invention has been described in terms of exemplary embodiments, it is not limited thereto. Rather, the appended claims should be construed broadly, to include other variants and embodiments of the invention which may be made by those skilled in the art without departing from the scope and range of equivalents of the invention.

What is claimed is:

1. A method comprising the steps of:
   (a) simulating on a processor a fabrication of a plurality of layout patterns by a lithographic process;
   (b) determining sensitivities of the layout patterns to a plurality of parameters based on the simulating;
   (c) using the sensitivities to calculate deviations of the layout patterns across a range of each respective one of the parameters; and
   (d) selecting ones of the layout patterns having predetermined deviation characteristics to be used as test patterns.

2. The method of claim 1, further comprising applying optical proximity correction, and repeating steps (a) through (d).

3. The method of claim 1, wherein step (b) includes calculating the sensitivity of one pattern of the layout patterns with respect to one of the parameters as a partial derivative of a deviation of the one pattern with respect to the one of the parameters, based on only two values of the one of the parameters and the corresponding two values of the deviation of the one pattern.

4. The method of claim 1, wherein step (c) includes calculating the deviations of the layout patterns using a first degree polynomial that is a linear combination of deviation portions due to each respective parameter, each respective deviation calculated based on the respective sensitivity of one pattern of the layout patterns to that parameter.

5. The method of claim 1, further comprising automatically selecting ones of the layout patterns having maximum or near-maximum deviations to be used as test patterns.

6. The method of claim 5, further comprising printing the ones of the layout patterns having maximum or near-maximum deviations on a test chip or test wafer.

7. The method of claim 1, further comprising selecting a plurality of directions, and selecting the respective layout patterns having the maximum deviation in each respective one of the plurality of directions to be used as test patterns.

8. The method of claim 1, wherein the predetermined deviation characteristics are selected from a group consisting of maximum, near maximum, minimum and near minimum deviations in a multidimensional process parameter space.

9. The method of claim 1, wherein the patterns are selected so as to have extremal sensitivities with respect to deviations in process parameters.

10. A computer-implemented system comprising:
   means for simulating on a processor a fabrication of a plurality of layout patterns by a lithographic process;
   means for determining sensitivities of the layout patterns to a plurality of parameters based on the simulating;
   means for using the sensitivities to calculate deviations of the layout patterns across a range of each respective one of the parameters; and
   means for selecting ones of the layout patterns having predetermined deviation characteristics to be used as test patterns.

11. A computer-readable medium encoded with computer program code, wherein, when the computer program code is executed by a processor, the processor performs a method comprising the steps of:
   (a) simulating on a processor a fabrication of a plurality of layout patterns by a lithographic process;
   (b) determining sensitivities of the layout patterns to a plurality of parameters based on the simulating;
   (c) using the sensitivities to calculate deviations of the layout patterns across a range of each respective one of the parameters; and
   (d) selecting ones of the layout patterns having predetermined deviation characteristics to be used as test patterns.

12. A computer implemented system comprising:
   means for receiving a set of priorities from a user;
   means for selecting a subset of features of a mask having the highest error rates, using a plurality of layout data;
   means for constructing an extrema map consistent with a user input including the set of priorities; and
   means for identifying one or more changes to the layout data based on the extrema map.

13. The computer implemented system of claim 12, further comprising means for systematically selecting characterizing structures from a layout that is generated from the layout data, the characterizing structures characterizing lithography and process performance of the layout.

14. The computer implemented system of claim 13, wherein the selecting of characterizing structures is based on lithographical properties of the characterizing structures.

15. The computer implemented system of claim 14, wherein the characterizing structures are selected based on the lithographical properties of the characterizing structures under variation of a plurality of process parameters.

16. The computer implemented system of claim 15, wherein the selecting of characterizing structures includes:
   characterizing each process parameter by a respective sensitivity of layout pattern to changes of that process parameter; and
   selecting a hull of a multi-dimensional process space by combining the sensitivities and determining maximum and/or minimum values of the combined sensitivities.

17. The computer implemented system of claim 16, wherein a function modeling non-monotonic sensitivity to one of the process parameters is defined using sampled extrema points.

18. The computer implemented system of claim 15, wherein measurements are used to calibrate the process parameters.

19. The computer implemented system of claim 18, wherein the measurements are deviations in distance, covered area or critical dimension.

20. An integrated circuit fabricated by a method comprising:
   (a) simulating a fabrication of a plurality of layout patterns by a lithographic process;
   (b) determining sensitivities of the layout patterns to a plurality of parameters based on the simulating;
   (c) selecting ones of the layout patterns to be used as test patterns based on the sensitivities;
   (d) fabricating the selected test patterns in an apparatus that performs the lithographic process;
   (e) performing an inspection on the fabricated test patterns;
   (f) adjusting the lithographic process based on the inspection; and
   (g) fabricating an integrated circuit in the apparatus using the adjusted lithographic process.

* * * * *